US012756319B1

(12) United States Patent
Guo et al.

(10) Patent No.: US 12,756,319 B1
(45) Date of Patent: Oct. 6, 2026

(54) INTEGRATED POWER MONITORING SYSTEM FOR TRANSIENT POWER MANAGEMENT ON A PER-RAIL OR PER-SUBSYSTEM BASIS

(71) Applicant: Amazon Technologies, Inc., Seattle, WA (US)

(72) Inventors: Linfei Guo, South San Francisco, CA (US); Sagnik Kar, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 5 days.

(21) Appl. No.: 19/081,908

(22) Filed: Mar. 17, 2025

(51) Int. Cl.
*H02M 3/16* (2006.01)
*G01R 21/133* (2006.01)

(52) U.S. Cl.
CPC ............ *H02M 3/16* (2013.01); *G01R 21/133* (2013.01)

(58) Field of Classification Search
CPC ............................... H02M 3/16; G01R 21/133
See application file for complete search history.

(56) References Cited

U.S. PATENT DOCUMENTS

| | | | | |
|---|---|---|---|---|
| 12,155,312 | B2 * | 11/2024 | Medina-Garcia | H02M 3/33571 |
| 12,627,267 | B1 * | 5/2026 | Khlat | H03F 3/211 |
| 2020/0333386 | A1 * | 10/2020 | Bennett | G01R 21/133 |
| 2022/0276694 | A1 * | 9/2022 | Kim | G06F 1/324 |
| 2023/0238800 | A1 * | 7/2023 | Musunuri | G06F 1/324 700/295 |
| 2024/0396449 | A1 * | 11/2024 | Park | H02M 3/156 |
| 2025/0172593 | A1 * | 5/2025 | Cui | G01R 21/133 |
| 2025/0314679 | A1 * | 10/2025 | Kaliyannan Eswaran | H02M 3/33523 |
| 2026/0079559 | A1 * | 3/2026 | Spindler | G06F 1/3243 |

* cited by examiner

*Primary Examiner* — Adam D Houston
(74) *Attorney, Agent, or Firm* — K&L Gates LLP

(57) ABSTRACT

Technologies directed to a power monitoring circuit are described. The power monitoring circuit includes multiple circuit branches each corresponding to an independent voltage rail of an independent subsystem and having an averaging circuit, an oversampling circuit, and an accumulating circuit, and an analog-to-digital converter (ADC) that selectively couples to each of the circuit branches. The ADC converts an accumulated current, output by the respective accumulating circuit, to a digital value representing power consumption by the respective independent subsystem. The ADC stores the digital value in a register. The digital values of each independent subsystem can be provided to the electronic device.

20 Claims, 7 Drawing Sheets

INTEGRATED POWER MONITORING SYSTEM FOR TRANSIENT POWER MANAGEMENT ON A PER-RAIL OR PER-SUBSYSTEM BASIS

BACKGROUND

Power management integrated circuits (PMICs) are responsible for power monitoring as they generate various voltage rails for different subsystems. However, current designs have notable shortcomings. One resistor sensing based approach involves inserting a sense resistor (Rsns) in series with a power path. While this method is accurate, it introduces additional power loss and cost due to the need for extra pins and sensing circuits for each rail. For example, sensing five rails requires ten additional pins, significantly increasing the overall pin count and cost. Moreover, this method is not configurable, as the Rsns cannot be removed if monitoring is unnecessary, and the sensing gain and accuracy are fixed based on the resistor value.

Another commonly used method is embedded full-cycle inductor current sensing, which generates a complete replica of the inductor current for each power stage. This approach is often used in high-performance server power designs for both power monitoring and control loops. However, it focuses on cycle-to-cycle instantaneous current/power, which is not needed for some applications. To obtain accurate average power, additional long-duration averaging and compensation are required. This method is overdesigned for some applications, incurring extra costs without added value.

BRIEF DESCRIPTION OF THE DRAWINGS

Various embodiments in accordance with the present disclosure will be described with reference to the drawings.

DETAILED DESCRIPTION

Figure 1:
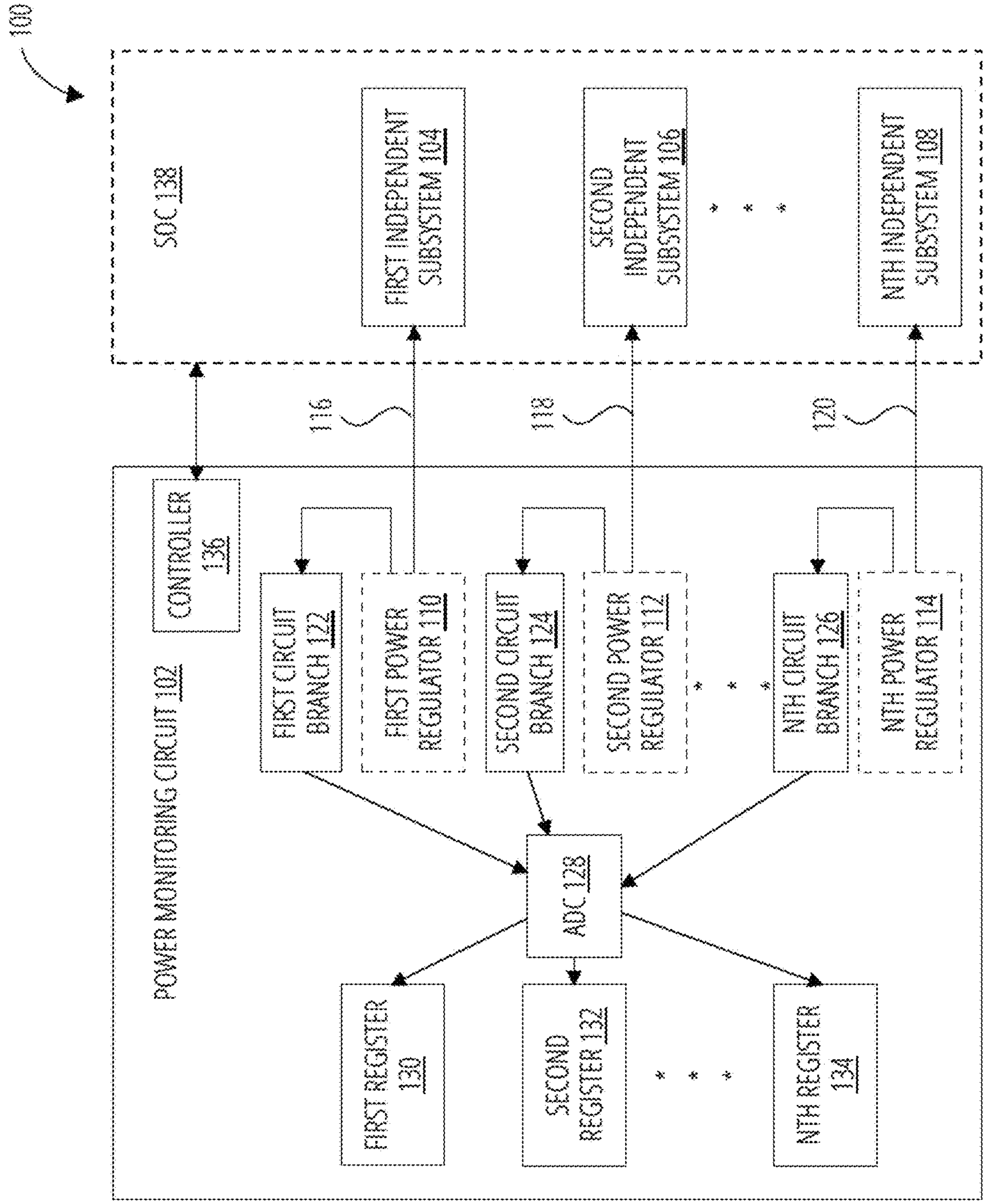
FIG. 1 is a block diagram of an electronic device with multiple independent subsystems and a power monitoring circuit that monitors power consumption at a per-subsystem level according to at least one embodiment.

Technologies directed to a power monitoring circuit are described. The following description sets forth numerous specific details, such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or presented in simple block diagram format to avoid obscuring the present disclosure unnecessarily. Thus, the specific details set forth are merely exemplary. Particular implementations may vary from these exemplary details and still be contemplated to be within the scope of the present disclosure.

As described above, existing PMIC designs have various deficiencies, including increasing pin count, increases silicon area, increasing costs, etc. Aspects and embodiments of the present disclosure address the above and other deficiencies by providing a per-rail power-monitoring design with the flexibility to configure it for different workloads and use cases. The system uses a hybrid averaging/accumulation method and time-interleaved sampling to calculate the average input power. Since all regulators share the same input voltage, the per-rail power-monitoring design samples the input current, rather than the output current. As a result, the input current serves as an accurate proxy for the output power. In addition, the solutions sample the input voltage, allowing easy calculation of input power for each subsystem. In at least one embodiment, a power monitoring circuit includes multiple circuit branches, each corresponding to an independent voltage rail of an independent subsystem of an electronic device coupled to the power monitoring circuit, and having an averaging circuit, an oversampling circuit, and an accumulating circuit, and an analog-to-digital converter (ADC) that selectively couples to each of the circuit branches. It should be noted that, in other embodiments, a sampling circuit can be used. That is, the signals can be sampled at different sampling rates, including oversampled rates, as described herein. The ADC converts an accumulated current, output by the respective accumulating circuit, to a digital value representing power consumption by the respective independent subsystem. The ADC stores the digital value in a register. The digital values of each independent subsystem can be provided to the electronic device.

In at least one embodiment, the power monitoring circuit is implemented in a PMIC that can be used as a subsystem to track the power consumption of the independent subsystems of an electronic device, as opposed to the entire power consumption of the electronic device. The power monitoring circuit can track the overall power, but tracking the power consumption of the independent voltage rails for the independent subsystems can server multiple functions, such as power consumption reporting, device characterization, dynamic tuning, or the like. It should be noted that voltage and current monitoring can be achieved in addition to tracking power consumption. Depending on system requirements and the sophistication of the power monitoring, this data can serve be used for these purposes. For example, an electronic device can include numerous subsystems, each of which can operate somewhat independently, and their control is generally driven by high-level, application-layer software. Each subsystem is typically powered by an independent voltage rail. For example, a central processing unit (CPU) subsystem is powered by a dedicated rail such as VDD_VCPU (or VDD_VPROC). Monitoring power consumption at the per-rail level can be used for system characterization and transmit power management. For system characterization, teal-time power monitoring allows accurate assessments of the performance of each subsystem, particularly in terms of power consumption. This is essential for understanding how various software implementations behave on real hardware. For transient power management, there are scenarios where the power source (e.g., a USB port or a battery) has limited capacity. Effective power budget management requires real-time insight into the power usage of each subsystem. In situations where power supply is insufficient, power/performance throttling is often necessary. Knowing how much power each subsystem consumes enables more effective throttling control and resource allocation.

FIG. 1 is a block diagram of an electronic device 100 with multiple independent subsystems and a power monitoring circuit 102 that monitors power consumption at a per-subsystem level according to at least one embodiment. The power monitoring circuit 102 can be coupled to a first independent subsystem 104, a second independent subsystem 106, and up to an Nth independent subsystem 108. In at least one embodiment, the first independent subsystem 104, 106, and Nth independent subsystem 108 are part of an System on Chip (SoC) 138. In other embodiments, the first independent subsystem 104, second independent subsystem 106, and Nth independent subsystem 108 can be implemented in one or more integrated circuits.

In at least one embodiment, the power monitoring circuit 102 is coupled to multiple power regulators, including a first power regulator 110, a second power regulator 112, and up to a Nth power regulator 114. The first power regulator 110 can provide a first independent voltage rail 116 to the first independent subsystem 104. The second power regulator 112 can provide a second independent voltage rail 118 to the second independent subsystem 106. The Nth power regulator 114 can provide a Nth independent voltage rail 120 to the Nth independent subsystem 108. It should be noted that the first power regulator 110, second power regulator 112, and Nth power regulator 114 are illustrated inside the power monitoring circuit 102 with dashed lines to indicate that the first power regulator 110, second power regulator 112, and 114 are not part of the power monitoring circuit 102. In other embodiments, the power monitoring circuit 102 can be implemented in a PMIC that includes the first power regulator 110, second power regulator 112, and Nth power regulator 114.

In at least one embodiment, the power monitoring circuit 102 includes multiple branch circuits, corresponding to the multiple power regulators. The multiple branches can include a first circuit branch 122, a second circuit branch 124, and up to an Nth circuit branch 126. Each of the first circuit branch 122, second circuit branch 124, and Nth circuit branch 126 are coupled to an analog-to-digital converter (ADC) 128. The ADC 128 is coupled to multiple registers, including a first register 130, a second register 132, and up to an Nth register 134.

In at least one embodiment, the first circuit branch 122 corresponds to the first independent voltage rail 116 provided to the first independent subsystem 104 of the electronic device 100. The first circuit branch 122 includes a first averaging circuit, a first oversampling circuit, and a first accumulating circuit. The second circuit branch 124 corresponds to the second independent voltage rail 118 provided to the second independent subsystem 106 of the electronic device 100. The second circuit branch 124 includes a second averaging circuit, a second oversampling circuit, and a second accumulating circuit. Similarly, the Nth circuit branch 126 can include an Nth averaging circuit, an Nth oversampling circuit, and an Nth accumulating circuit. These circuits are described in more detail below. During operation, the ADC 128 can selectively couple to the first circuit branch 122, 124, and Nth circuit branch 126. The ADC 128 can convert a first accumulated current, output by the first circuit branch 122, to a first digital value representing power consumption of the first independent subsystem 104, and store the first digital value in a first register 130. The ADC 128 can convert a second accumulated current, output by the second circuit branch 124, to a second digital value representing power consumption of the second independent subsystem 106, and store the second digital value in a second register 132. The ADC 128 can convert an Nth accumulated current, output by the Nth circuit branch 126, to an Nth digital value representing power consumption of the Nth independent subsystem 108, and store the Nth digital value in an Nth register 134.

In at least one embodiment, the power monitoring circuit 102 is programmable. In at least one embodiment, the SoC 138 can configure the power monitoring circuit 102 using a set of configuration parameter for each of the independent subsystems. That is, the SoC 138 can configure the first circuit branch 122 using a first set of configuration parameters and the second circuit branch 124 using a second set of configuration parameters that are different than the first set of configuration parameters. In at least one embodiment, a high-level, application-layer of the SoC 138 can configure the power monitoring circuit 102.

In at least one embodiment, the power monitoring circuit 102 includes a controller 136. The controller 136 can receive one or more commands from the SoC 138. In at least one embodiment, the controller 136 can receive a first command from the first independent subsystem 104, a second command from the second independent subsystem 106, and an Nth command from the Nth independent subsystem 108. In another embodiment, a centralized controller of the electronic device 100 can send the one or more commands to the controller 136. The controller 136 can also retrieve and send (push or pull) the digital values in the registers to the SoC 138 (or the respective independent subsystems. Alternatively, the controller 136 can send the respective digital values to the respective independent subsystems.

In at least one embodiment, the power monitoring circuit 102 can include one or more multiplexers (or other types of selection circuits) that can couple each of the multiple circuit branches (e.g., 122, 124, 126) to the ADC 128. The multiple circuit branches can have one or more common resources, such as a common oversampling circuit, a common accumulating circuit, or both.

In at least one embodiment, the first circuit branch 122 includes a first averaging circuit to determine an average current by measuring and averaging an input current of the first independent voltage rail 116, a first oversampling circuit to determine an oversampled current by oversampling the average current, and a first accumulating circuit to determine a first accumulated current by accumulating the oversampled current. The first circuit branch 122 can output the first accumulated current to the ADC 128 to convert the first accumulated current to the first digital value to be stored in the first register 130. In at least one embodiment, the second circuit branch 124 includes a second averaging circuit to determine an average current by measuring and averaging an input current of the second independent voltage rail 118, a second oversampling circuit to determine an oversampled current by oversampling the average current, and a second accumulating circuit to determine the second accumulated current by accumulating the oversampled current. The second circuit branch 124 can output the second accumulated current to the ADC 128 to convert the second accumulated current to the second digital value to be stored in the second register 132. Similarly, the Nth circuit branch

126 can include an Nth averaging circuit to determine an average current by measuring and averaging an input current of the Nth independent voltage rail 120, an Nth oversampling circuit to determine an oversampled current by oversampling the average current, and an Nth accumulating circuit to determine an Nth accumulated current by accumulating the oversampled current. The Nth circuit branch 126 can output the Nth accumulated current to the ADC 128 to convert the nth accumulated current to the Nth digital value to be stored in the Nth register 134.

Figure 2:
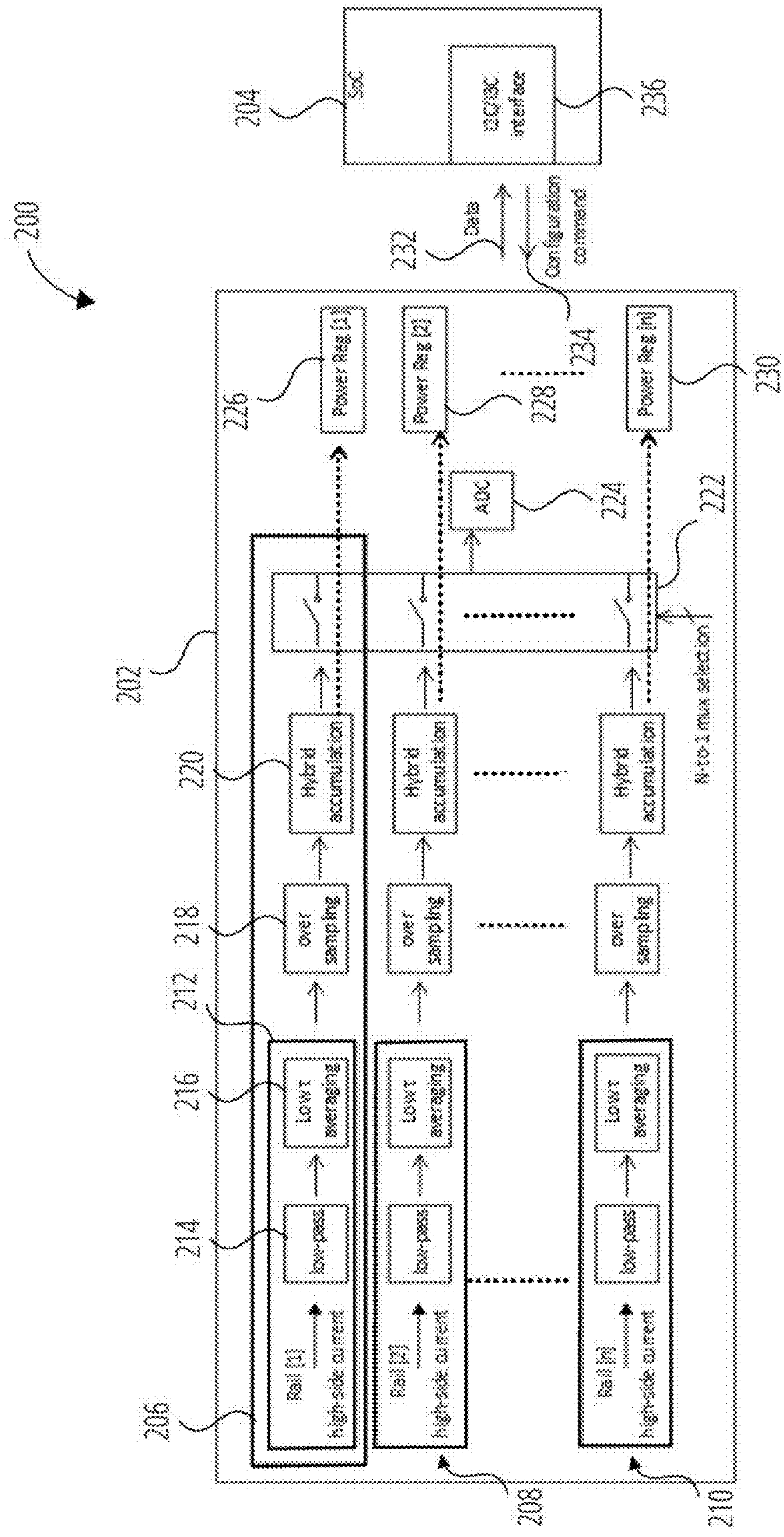
FIG. 2 is a block diagram of a power management integrated circuit (PMIC) coupled to an SoC with multiple independent subsystems and monitors power consumption at a per-subsystem level according to at least one embodiment.

FIG. 2 is a block diagram of a PMIC 200 coupled to a SoC 204 with multiple independent subsystems and monitors power consumption at a per-subsystem level according to at least one embodiment. The PMIC 200 includes a first circuit branch 206, a second circuit branch 208, and up to a Nth circuit branch 210. The first circuit branch 206, the second circuit branch 208, and the Nth circuit branch 210 are coupled to an N-to-1 multiplexer 222, which is coupled to an ADC 224. The N-to-1 multiplexer 222 can be controlled to selectively couple each of the first circuit branch 206, the second circuit branch 208, and Nth circuit branch 210 to the ADC 224 in a time-multiplexed manner. The output of the ADC 224 can store the digital values in the corresponding register. That is, the ADC 224 can convert a first accumulated current from the first circuit branch 206 to a first digital value, and the first digital value is stored in a first register 226. Similarly, the ADC 224 can convert a second accumulated current from the second circuit branch 208 to a second digital value, and the second digital value is stored in a second register 228. Similarly, the ADC 224 can convert an Nth accumulated current from the Nth circuit branch 210 to an Nth digital value, and the Nth digital value is stored in a Nth register 230.

In at least one embodiment, each of the circuit branches includes an averaging circuit 212, an oversampling circuit 218, and an accumulating circuit 220. In at least one embodiment, the averaging circuit 212 includes a low-pass filter 214 and a low-time constant averaging circuit 216. The averaging circuit 212 can measure and average an input current of a respective power regulator. In at least one embodiment, the input current can be a high-side current of an independent voltage rail. The averaging circuit 212 can output an average current to the oversampling circuit 218. The oversampling circuit 218 can oversample the average current to obtain an oversampled current. The accumulating circuit 220 can receive the oversampled current and accumulate the oversampled current to obtain an accumulated current. As described above, the N-to-1 multiplexer 222 can selectively couple the accumulating circuit 220 to the ADC 224 and the ADC 224 can convert the accumulated current into a digital value that can be stored in one of the registers.

In at least one embodiment, the PMIC 200 includes a set of N number of power regulators (as illustrated in FIG. 1), where N is a positive integer greater than one. Each power regulator of the set of N number of power regulators can provide an independent voltage rail to an independent subsystem of the SoC 204. That is, each of the independent subsystems are coupled to the PMIC 200. The multiple independent subsystems of the SoC 204 can include subsystems directed to connectivity (e.g., Wi-Fi, Bluetooth), general-purpose computing (e.g., CPU), edge-AI compute (neural network accelerator (NNA)), video processing (e.g., display and video encoder/decoders), audio processing (including CODEC), etc. In at least one embodiment, the SoC 204 includes two or more of the following: a CPU, a graphics processing unit (GPU), a digital signal processor (DSP), a neural processing unit (NPU), a microcontroller unit (MCU), a memory subsystem, a memory controller, a network-on-chip (NoC), an interconnect bus, a direct memory access (DMA) controller, a sensor and control subsystem, a wireless communication component, an accelerator, a video processing module, an audio processing module, a network adapter, a network interface card (NIC), a switch, etc. In at least one embodiment, the SoC 204 includes a CPU as the first independent subsystem, and another one of the components described above as the second independent subsystem.

In at least one embodiment, the PMIC 200 can include a power monitoring subsystem, including a set of N circuit branches 206, 208, 210, the N-to-1 multiplexer 222, the ADC 224, and a set of N registers 226-230. Each register of the set of N number of registers can store a digital value representing power consumption of one of the N independent voltage rails. The set of N circuit branches are coupled to the N-to-1 multiplexer 222. Each of the set of N circuit branches 206, 208, 210, includes an averaging circuit 212 to determine an average current by measuring and averaging an input current of the independent voltage rail corresponding to the respective independent subsystem. Each of the set of N circuit branches 206, 208, 210, includes an oversampling circuit 218 to determine an oversampled current by oversampling the average current. Each of the set of N circuit branches 206, 208, 210, includes an accumulating circuit 220 to determine an accumulated current by accumulating the oversampled current. The ADC 224, for each of the independent voltage rail, is to convert the accumulated current to the digital value representing the power consumption of the respective independent voltage rail and store the digital value in the respective register of the set of N number of registers 226, 228, 230. In at least one embodiment, the ADC 224 is a single ADC that is coupled to the N-to-1 multiplexer 222. In at least one embodiment, multiple ADCs can be coupled to the N-to-1 multiplexer in other configurations.

In at least one embodiment, the power monitoring subsystem includes a controller (e.g., illustrated in FIG. 1). The controller can send data 232, including the digital values of the registers 226, 228, 230, and receive one or more configuration command(s) 234. The controller can communicate with interface circuitry 236 of the SoC 204. Similarly, the PMIC 200 can include interface circuitry to communicate with the interface circuitry 236 of the SoC 204. In at least one embodiment, through the configuration command(s) 234, each power monitor for individual rails can be configured independently. That is, each circuit branch can be individually configured. The configuration command(s) 234 can specify a set of configuration parameters for each independent subsystem (or each independent voltage rail). The set of configuration parameters can include a dynamic range, a resolution (or accuracy), an accumulation time, a sampling rate, etc., for the independent voltage rail provided to the respective independent system of the SoC 204. The controller can then configure the respective circuit branch according to the set of configuration parameters of the respective independent voltage rail. For example, configuring the oversampling and hybrid accumulation allows flexibility to accurately control the accuracy and the accumulation length, avoiding the ADC 224 from being the bottleneck.

In at least one embodiment, the PMIC 200 receives a first command from the SoC 204, the first command including a first set of configuration parameters corresponding to the first circuit branch 206. The first set of configuration parameters includes one or more values specifying a dynamic range, a resolution, an accumulation time, and/or a sampling rate for the independent voltage rail provided to a first independent subsystem of the SoC 204. The PMIC 200 can configure the first circuit branch 206 according to the first set of configuration parameters. In a further embodiment, the PMIC 200 receives a second command from the SoC 204, the second command including a second set of configuration parameters includes one or more values specifying a dynamic range, a resolution, an accumulation time, and/or a sampling rate for the independent voltage rail provided to a second independent subsystem of the SoC 204. The first set and the second set of configuration parameters can be the same or different. The PMIC 200 can configure the second circuit branch 208 according to the second set of configuration parameters. The PMIC 200 can provide the digital values, stored in the set of N number of registers to the SoC 204. In at least one embodiment, an application executed by the SoC 204 can send the one or more configuration command(s) 234 and receive the data 232 from the PMIC 200.

In at least one embodiment, the PMIC 200 can be used as a subsystem to track the power consumption of the independent subsystems of the SoC 204, as opposed to the entire power consumption of the SoC 204. The PMIC 200 can track the overall power, but tracking the power consumption of the independent voltage rails for the independent subsystems can server multiple functions, such as power consumption reporting, device characterization, dynamic tuning, or the like. It should be noted that voltage and current monitoring can be achieved in addition to tracking power consumption. Depending on system requirements and the sophistication of the power monitoring, this data can serve be used for these purposes. For example, an electronic device can include numerous subsystems, each of which can operate somewhat independently, and their control is generally driven by high-level, application-layer software. Each subsystem is typically powered by an independent voltage rail. For example, the CPU subsystem is powered by a dedicated rail such as VDD_VCPU (or VDD_VPROC). Monitoring power consumption at the per-rail level can be used for system characterization and transmit power management. For system characterization, teal-time power monitoring allows accurate assessments of the performance of each subsystem, particularly in terms of power consumption. This is essential for understanding how various software implementations behave on real hardware. For transient power management, there are scenarios where the power source (e.g., a USB port or a battery) has limited capacity. Effective power budget management requires real-time insight into the power usage of each subsystem. In situations where power supply is insufficient, power/performance throttling is often necessary. Knowing how much power each subsystem consumes enables more effective throttling control and resource allocation.

In at least one embodiment, the power monitoring circuit of the PMIC 200 includes a per-rail power-monitoring design that can be specifically tailored to specific applications with the flexibility to configure it for different workloads and use cases (i.e., a specific combination of independent subsystems in a SoC or electronic device). The power monitoring circuit uses a hybrid averaging/accumulation method and time-interleaved sampling to calculate the average input power. In at least one embodiment, the input current is sampled, rather than the output current since all regulators share the same input voltage. As a result, the input current serves as an accurate proxy for the output power. In addition, the input voltage can be sampled, allowing easy calculation of input power for each independent subsystem. Also, as described herein, through configuration commands, each power monitor (for individual rails) can be configured independently. The configurations can include different parameters, for example, dynamic range, accuracy, resolution, accumulation time, sampling rate, etc. Furthermore, the over-sampling and hybrid accumulation allows the flexibility to accurately control the accuracy and the accumulation length, avoid the ADC 224 being the bottleneck in the system design.

In other embodiments, the power monitoring circuit can be implemented in various configurations, such as illustrated and described below with respect to FIG. 3.

Figure 3:
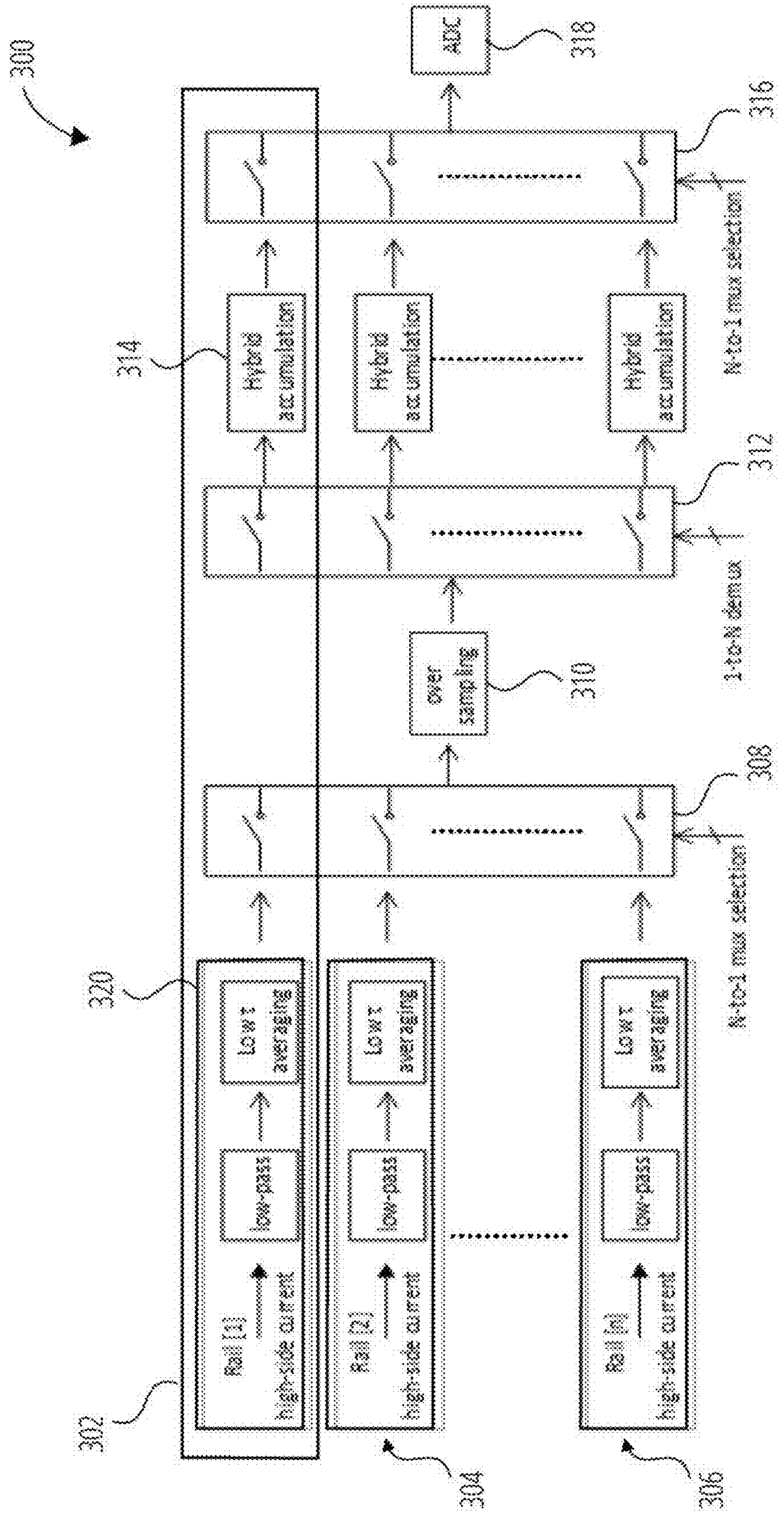
FIG. 3 is a block diagram of a power monitoring circuit that monitors power consumption at a per-subsystem level according to at least one embodiment.

FIG. 3 is a block diagram of a power monitoring circuit 300 that monitors power consumption at a per-subsystem level according to at least one embodiment. The power monitoring circuit 300 includes a first circuit branch 302, a second circuit branch 304, and up to a Nth circuit branch 306. The first circuit branch 302, second circuit branch 304, Nth circuit branch 306 are coupled to an N-to-1 multiplexer 308, which is coupled to a common oversampling circuit 310, which is coupled to a 1-to-N de-multiplexer 312. Each branch includes an accumulating circuit 314, which is coupled between the 1-to-N de-multiplexer 312 and a N-to-1 multiplexer 316, which is coupled to an ADC 318.

The N-to-1 multiplexer 308 can be controlled to selectively couple each of the first circuit branch 302, the second circuit branch 304, and Nth circuit branch 306 to the common oversampling circuit 310 in a time-multiplexed manner. Similarly, the 1-to-N de-multiplexer 312 and N-to-1 multiplexer 316 can be controlled to selective couple the common oversampling circuit 310 to the respective accumulating circuit 314, and the respective accumulating circuit 314 to the ADC 318. The output of the ADC 318 can store the digital values in the corresponding register. That is, the ADC 318 can convert a first accumulated current from the first circuit branch 302 to a first digital value, and the first digital value is stored in a first register. Similarly, the ADC 318 can convert a second accumulated current from the second circuit branch 304 to a second digital value, and the second digital value is stored in a second register. Similarly, the ADC 318 can convert an Nth accumulated current from the Nth circuit branch 306 to an Nth digital value, and the Nth digital value is stored in an Nth register.

In at least one embodiment, each of the circuit branches includes an averaging circuit 320, the common oversampling circuit 310, and an accumulating circuit 314. In at least one embodiment, the averaging circuit 320 includes a low-pass filter and a low-time constant averaging circuit. The averaging circuit 320 can measure and average an input current of a respective power regulator. In at least one embodiment, the input current can be a high-side current of an independent voltage rail. The averaging circuit 320 can output an average current to the oversampling circuit 310 via the N-to-1 multiplexer 308. The oversampling circuit 310 can oversample the average current to obtain an oversampled current. The accumulating circuit 314 can receive the oversampled current via the 1-to-N de-multiplexer 312 and accumulate the oversampled current to obtain an accumulated current. As described above, the N-to-1 multiplexer 316 can selectively couple the accumulating circuit 314 to the ADC 318, and the ADC 318 can convert the accumulated current into a digital value that can be stored in one of the registers.

In at least one embodiment, the power monitoring circuit 300 includes a per-rail power-monitoring design with time-interleaved over-sampling that can be specifically tailored to specific applications with the flexibility to configure it for different workloads and use cases (i.e., a specific combination of independent subsystems in a SoC or electronic device). In this embodiment, a single sampler is shared across multiple voltage rails. This design reduces hardware complexity and silicon area but requires time-interleaved sampling to ensure all rails are accurately monitored. The trade-off here is that timing becomes more critical, as the power monitoring circuit 300 needs to manage the sampling intervals carefully to avoid missing or misaligning power data. In contrast, the power monitoring circuit design in PMIC 200 with independent samplers simplifies timing but increases the silicon area required.

Additionally, in the design of the power monitoring circuit 300, the sampler is shared while the accumulator is still not shared due to the limitations of ADC conversion speed. Sharing the accumulator could introduce delays or inaccuracies in the power readings if the ADC 318 is not fast enough. However, if a sufficiently fast ADC is available, the power monitoring circuit 300 could be implemented differently with sharing a common accumulating circuit as well. Using time-interleaved sampling and interleaved accumulating can further reduce silicon area by minimizing the number of accumulators required.

Figure 4:
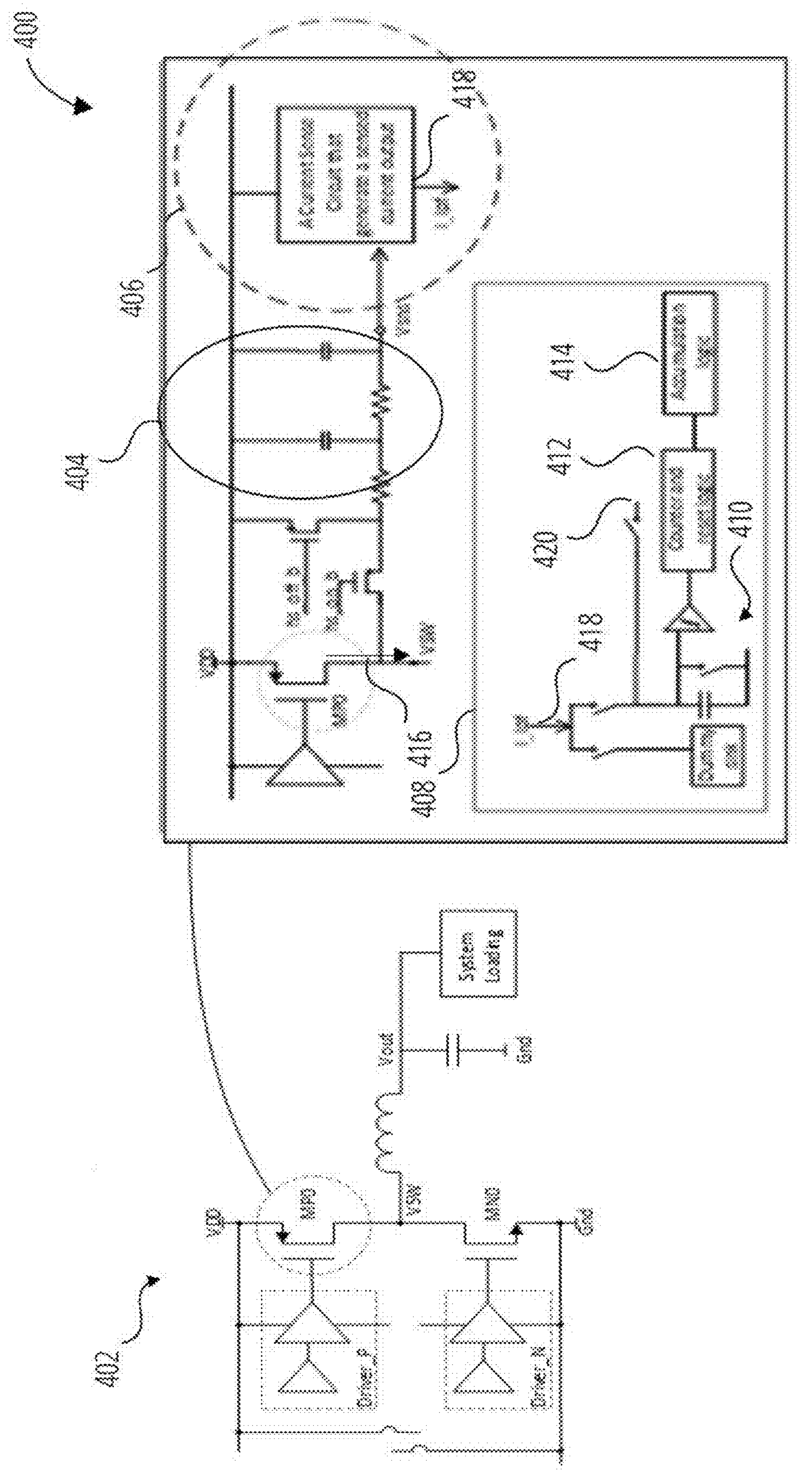
FIG. 4 is a circuit diagram of a power monitoring circuit coupled to a power regulator according to at least one embodiment.

In at least one embodiment, the circuit branches of the power monitoring circuit 300 can be implemented in a single-rail design, such as illustrated in FIG. 4.

FIG. 4 is a circuit diagram of a power monitoring circuit 400 coupled to a power regulator 402 according to at least one embodiment. FIG. 4 provides a detailed example of a single-rail design using sampled averaging and hybrid accumulation. In this embodiment, the power monitoring circuit 400 includes a low-pass filter 404 that is coupled to a high-side rail to measure and filter a high-side output current 416 of the power regulator 402, the low-pass filter 404 outputting a sensed voltage (Vsns) corresponding to the high-side output current 416. The low-pass filter 404 can include one or more stages of capacitors and resistors to create a low-pass filter with a specific time constant. The power monitoring circuit 400 can include a current sense circuit 406 that generates a filtered current 418 (labeled as I_lpf) that is a specified proportion of the of the high-side output current 416 (i.e., lpf constant*1/K). The power monitoring circuit 400 also includes a hybrid accumulation circuit 408, including an integrator 410, counter and reset logic 412, and accumulation logic 414. The integrator 410 receives the filtered current 418 (labeled as I_lpf) from the current sense circuit 406 and can average the filtered current 418. The counter and reset logic 410 can oversample the average filtered current 418 using a sampling rate, and the oversampled current can be accumulated by the accumulation logic 414 over an accumulation period. The integrator 410 can be coupled to a capacitor that can accumulates charge over a number of cycles, whereas the counter and reset logic 412 can configure sampling behavior, e.g., different sampling rate and different sampling windows to achieve an effective large time-constant filtering and accumulation. The accumulation logic 414 has the ability to retain (hold) a final accumulated value for the ADC to read. As described above, each voltage rail can be individually configured to target specific averaging window lengths, for example, ranging from 1 milliseconds (ms) to 20 ms. The control the accumulation of the average input current over an accumulation period. In at least one embodiment, the accumulation logic 414 can output a first digital value, and an output voltage 420 can be output to the ADC. The ADC converts this to a second digital value. The second digital value and the first digital value can be added together to represent a power consumption of the respective circuit branch. The integrator 410, counter and reset logic 412, and accumulation logic 414 can implement the averaging circuit, the oversampling circuit, and the accumulating circuit described above. The output of the power monitoring circuit 400 can be sampled by an ADC. In at least one embodiment, the accumulation logic 412*a* voltage of the power monitoring circuit 400 can provide an averaged power information for the independent voltage rail and can be configured to target specific averaging window lengths for the independent voltage rail. This hybrid accumulation method, combined with time-interleaved ADC sampling, allows the use of a relatively slow ADC (i.e., sampling speeds less than 10 microseconds (μs)), making the solution more area-efficient and cost-efficient.

It should be noted that the power monitoring circuit 400 offers configurable sampling rates, accumulation lengths, and resolution, making them flexible for various system use cases. For example, different workloads may have distinct power profiles. In video-based subsystems, which typically operate at a fixed frame rate of 16 ms per frame, capturing the power profile at 16 milliseconds (ms) intervals can be beneficial. The system can be flexibly configured to match this specific averaging window, ensuring optimal power monitoring for the target use case. The power monitoring circuit 400 can be configured to that particular averaging window for the independent voltage rail supplying power to the video-based subsystem.

The proposed power monitoring circuits described herein, such as the power monitoring circuit 400, can provide averaged power information for multiple independent voltage rails corresponding to multiple independent subsystems. The power monitoring circuits can be configured to target the averaging window length of interests (e.g., 1 ms-20 ms) for each of the independent voltage rails. In addition, the hybrid accumulation and time-interleaved ADC sampling allows slower ADCs (sampling speed >10 μs). In addition, the sampling rate, the accumulation length as well as the resolution are entirely configurable, making the power monitoring circuit very flexible for various system use-cases.

Figure 5:
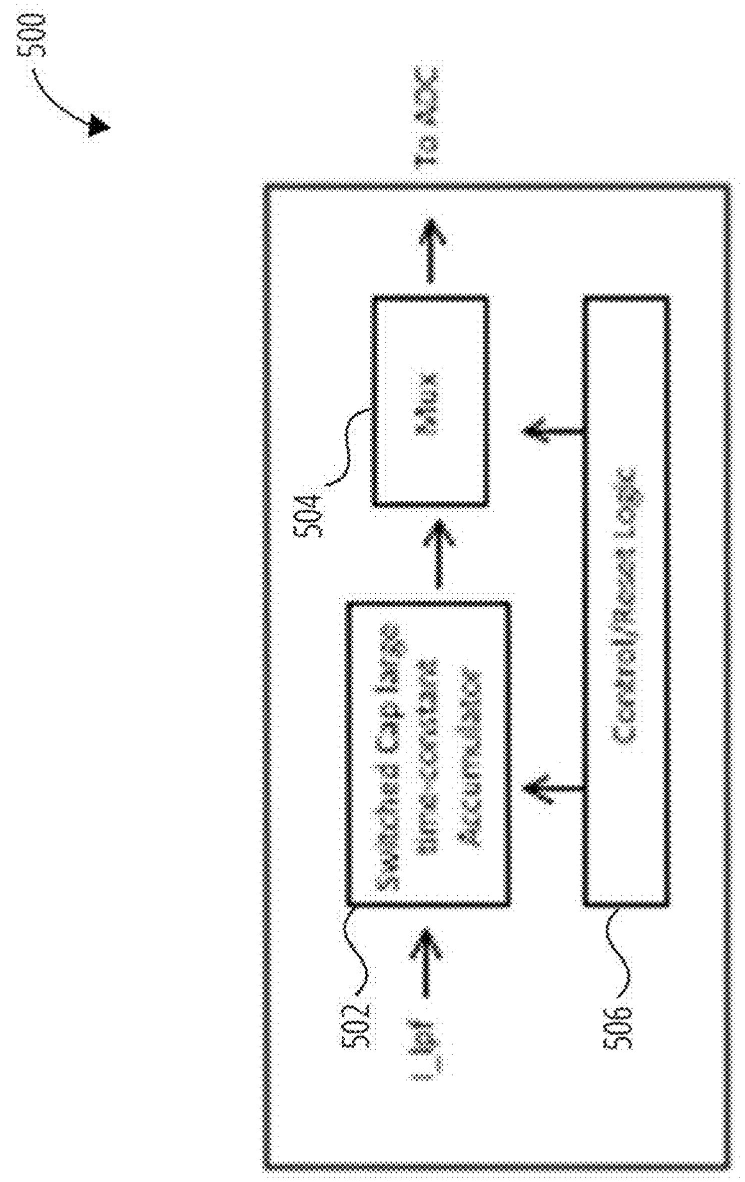
FIG. 5 is a block diagram of an accumulation circuit according to at least one embodiment.

In other embodiments, the hybrid accumulation circuit 408 can be implemented in other ways, such as illustrated in FIG. 5.

FIG. 5 is a block diagram of an accumulation circuit 500 according to at least one embodiment. The accumulation circuit 500 includes a switched-based accumulator 502, multiplexer 504, and control and reset logic 506. The control and reset logic 506 can control the multiplexer 504 according to the configurable sampling behavior, i.e., different sampling rate and different sampling window, to achieve an effective large time-constant filtering and accumulation as described above. The control and reset logic 506 can also control the multiplexer 504 to allow the ADC to read the finale accumulated value.

In at least one embodiment, a power monitoring circuit includes a first circuit branch, a second circuit branch, and an ADC. The first circuit branch corresponding to a first independent voltage rail provided to a first independent subsystem of an electronic device. The second circuit branch corresponds to a second independent voltage rail provided to a second independent subsystem of the electronic device. The first and second independent subsystems are coupled to the power monitoring circuit. The power monitoring circuit includes or is coupled to a first power regulator to provide the first independent voltage rail, and a second power regulator to provide the second independent voltage rail. The first circuit branch, which is coupled to the first power regulator, includes a first averaging circuit, a first oversampling circuit, and a first accumulating circuit. The second circuit branch, which is coupled to the second power regulator, includes a second averaging circuit, a second oversampling circuit, and a second accumulating circuit. The ADC selectively couples to first circuit branch and the second circuit branch. The ADC, when selectively coupled to the first circuit branch, converts a first accumulated current, output by the first accumulating circuit, to a first digital value and stores the first digital value in a first register. The first digital value represents power consumption of the first independent subsystem. The ADC, when selectively coupled to the second circuit branch, converts a second accumulated current, output by the second accumulating circuit, to a second digital value and store the second digital value in a second register. The second digital value represents power consumption of the second independent subsystem. The power monitoring circuit can include a multiplexer coupled to the first circuit branch, the second circuit branch, and the ADC to selectively couple the first circuit branch to the ADC and the second circuit branch to the ADC.

In a further embodiment, the first averaging circuit can determine an average current by measuring and averaging an input current of the first independent voltage rail. The first oversampling circuit can determine an oversampled current by oversampling the average current. The first accumulating circuit can determine the first accumulated current by accumulating the oversampled current. In at least one embodiment, the first averaging circuit is a first time-constant averaging circuit coupled to a first low-pass filter, and the second averaging circuit is a second time-constant averaging circuit coupled to a second low-pass filter. In at least one embodiment, the first oversampling circuit can oversample a first average current, output from the first averaging circuit, using a first sampling rate. The second oversampling circuit can oversample a second average current, output from the second averaging circuit, using a second sampling rate that is different than the first sampling rate. In at least one embodiment, the first accumulating circuit can accumulate a first oversampled current, output from the first oversampling circuit, over a first accumulation period. The second accumulating circuit can accumulate a second oversampled current, output from the second oversampling circuit, over a second accumulation period that is different than the first accumulation period.

In at least one embodiment, the first averaging circuit includes an integrator, the first oversampling circuit includes a counter and reset logic coupled to the output of the integrator, and the first accumulating circuit includes accumulation logic coupled to the output of the counter. In at least one embodiment, the first averaging circuit includes a switched-based accumulator, the first oversampling circuit includes a counter and reset logic coupled to the switched-based accumulator, and the first accumulating circuit includes accumulation logic coupled to the output of the switched-based accumulator. In other embodiments, the circuit branches can include other circuits to determine an average input current for determining power consumption of the respective independent voltage rail for an independent subsystem.

In another embodiment, the power monitoring circuit includes a first multiplexer coupled to the first averaging circuit, the second averaging circuit, and the first oversampling circuit. In this embodiment, the first oversampling circuit and the second oversampling circuit are a common oversampling circuit. The power monitoring circuit also includes a de-multiplexer coupled to the common oversampling circuit, the first accumulating circuit, and the second accumulating circuit. The power monitoring circuit includes a second multiplexer coupled to the first accumulating circuit, the second accumulating circuit, and the ADC.

In at least one embodiment, the power monitoring circuit includes a first multiplexer coupled to the first averaging circuit, the second averaging circuit, and the first oversampling circuit, where the first oversampling circuit and the second oversampling circuit are a common oversampling circuit, and where the first accumulating circuit and the second accumulating circuit are a common accumulating circuit. In this embodiment, the ADC is coupled to the common accumulating circuit.

In at least one embodiment, the power monitoring circuit includes a controller. The controller can receive one or more commands from the electronic device, and can provide the first digital value and the second digital value to the electronic device. In at least one embodiment, the controller can receive a first command from the electronic device, and a second command from the electronic device. The first command includes a first set of configuration parameters corresponding to the first circuit branch, and the second command includes a second set of configuration parameters corresponding to the second circuit branch. The first set of configuration parameters includes at least one of a dynamic range, a resolution, an accumulation time, or a sampling rate for the first independent voltage rail. The second set of configuration parameters comprising at least one of a dynamic range, a resolution, an accumulation time, or a sampling rate for the second independent voltage rail. The controller can configure the first circuit branch according to the first set of configuration parameters, and the second circuit branch according to the second set of configuration parameters. In at least one embodiment, the controller can receive a first command from a video processing module of the electronic device. The first command can include a parameter that specifies an averaging window length. The averaging window length is equal to or corresponds to a fixed frame rate of the video processing module. The controller can configure the first circuit branch according to the parameter. The controller can provide the first digital value to the electronic device.

In at least one embodiment, the electronic device includes a SoC including the multiple independent subsystems. The multiple independent subsystems can include a CPU and at least one of a wireless communication component, an accelerator, a video processing module, or an audio processing module. The CPU is the first independent subsystem, and the at least one of the wireless communication component, the accelerator, the video processing module, or the audio processing module is the second independent subsystem.

Figure 6:
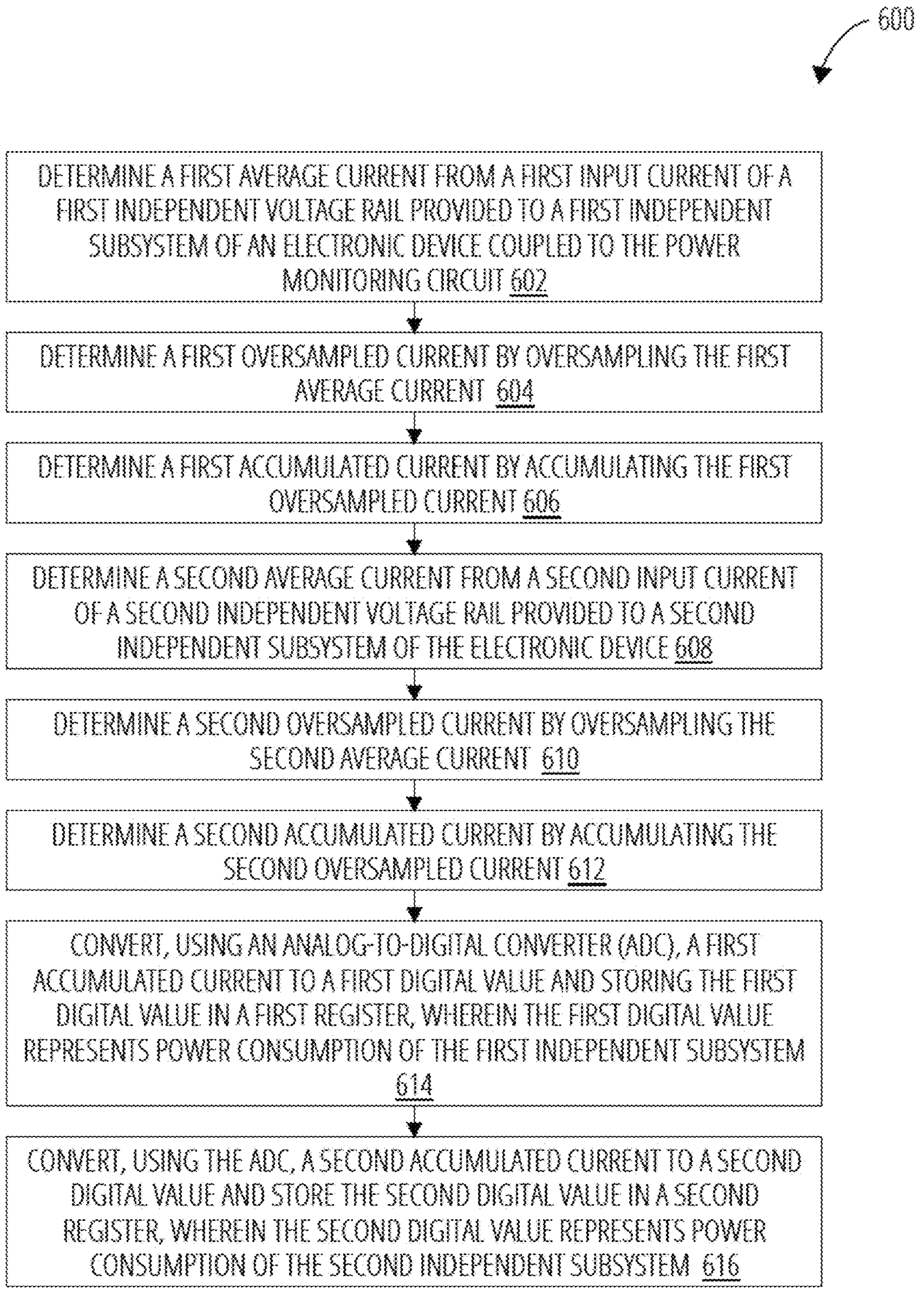
FIG. 6 is a flow chart of a method of monitoring power consumption of independent voltage rails according to at least one embodiment.

FIG. 6 is a flow chart of a method 600 of monitoring power consumption of independent voltage rails according to at least one embodiment. The method 600 may be performed by processing logic that may comprise hardware (e.g., circuitry, dedicated logic, programmable logic, microcode, etc.), software (e.g., instructions run on a processing device to perform hardware simulation), or a combination thereof. In one embodiment, the method 600 is performed by power monitoring circuit 102 of FIG. 1, PMIC 200 of FIG. 2, power monitoring circuit 300 of FIG. 3, power monitoring circuit 400 of FIG. 4, or accumulation circuit 500 of FIG. 5. The method 600 can be performed by other devices described herein.

Referring to FIG. 5, the method accumulation circuit 500 begins with the processing logic determining a first average current from a first input current of a first independent voltage rail provided to a first independent subsystem of an electronic device coupled to the power monitoring circuit (block 602). At block 604, the processing logic determines a first oversampled current by oversampling the first average current. At block 606, the processing logic determines a first accumulated current by accumulating the first oversampled current. At block 608, the processing logic determines a second average current from a second input current of a second independent voltage rail provided to a second independent subsystem of the electronic device. At block 610, the processing logic determines a second oversampled current by oversampling the second average current. At block 612, the processing logic determines a second accumulated current by accumulating the second oversampled current. At block 614, the processing logic converts, using an ADC, a first accumulated current to a first digital value and storing the first digital value in a first register. The first digital value represents power consumption of the first independent subsystem. At block 616, the processing logic converts, using the ADC, a second accumulated current to a second digital value and store the second digital value in a second register. The second digital value represents power consumption of the second independent subsystem.

In a further embodiment, the determining the first oversampled current at block 604 and determining the second oversampled current at block 610 is done using a common oversampling circuit.

In a further embodiment, the determining the first oversampled current at block 604 and determining the second oversampled current at block 610 is done using a common oversampling circuit, and determining the first accumulated current at block 606 and determining the second accumulated current at block 612 is done using a common accumulating circuit.

In at least one embodiment, the processing logic receives a first command from the electronic device. The first command includes a first set of configuration parameters corresponding to the first independent voltage rail. The processing logic configures the power monitoring circuit to determine the first digital value according to the first set of configuration parameters. The processing logic receives a second command from the electronic device. The second command includes a second set of configuration parameters corresponding to the second independent voltage rail. The second set of configuration parameters can be different than the first set of configuration parameters. The processing logic configures the power monitoring circuit to determine the second digital value according to the first set of configuration parameters. The processing logic provides the first digital value and the second digital value to the electronic device.

Figure 7:
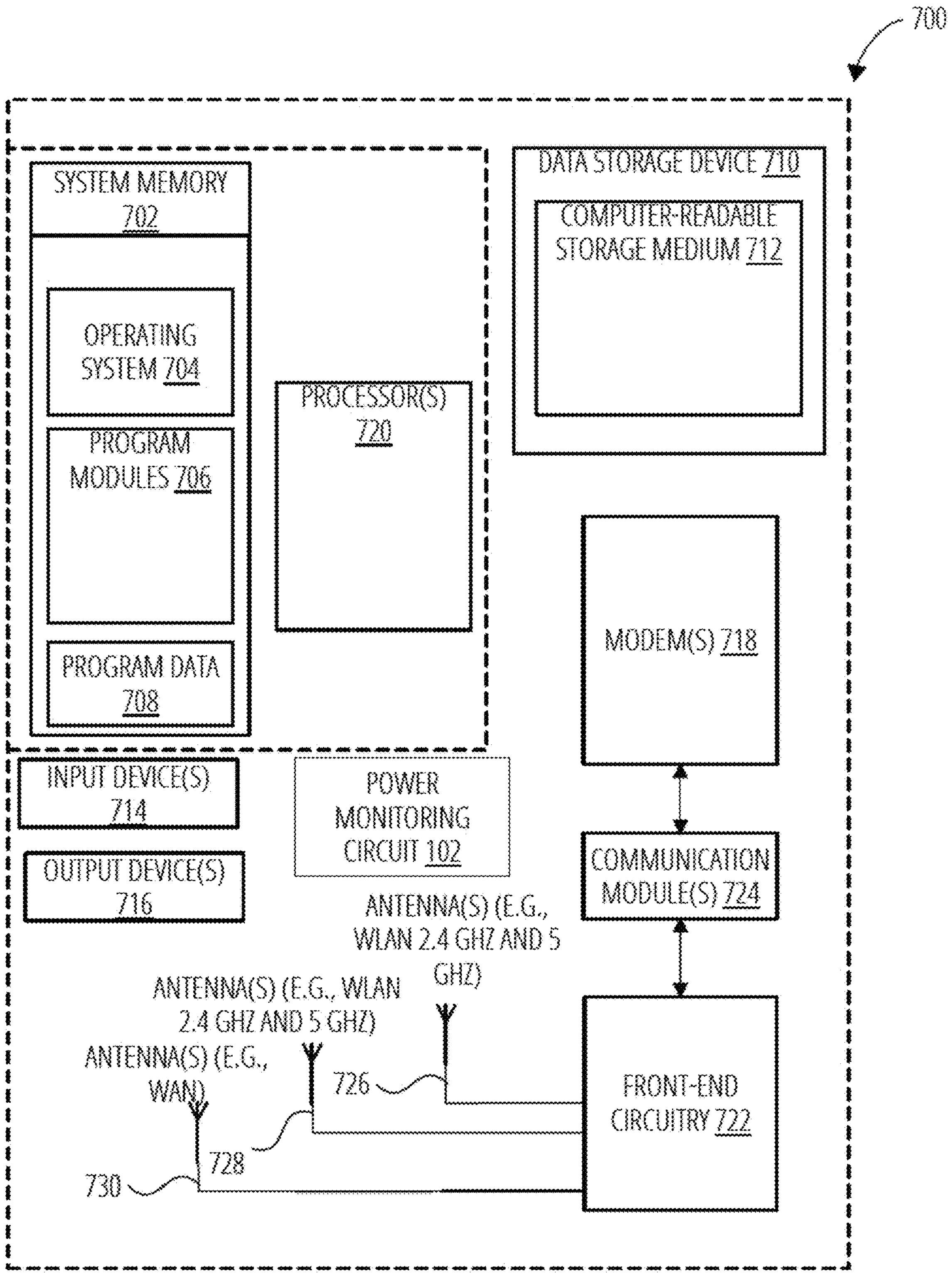
FIG. 7 is a block diagram of an electronic device with a power monitoring circuit according to at least one embodiment of the present disclosure.

FIG. 7 is a block diagram of an electronic device 700 with a power monitoring circuit 102 according to at least one embodiment of the present disclosure. The electronic device 700 may correspond to the user devices described herein. The electronic device 700 includes one or more processor(s) 720, such as one or more central processing units (CPUs), microcontrollers, field-programmable gate arrays, or other types of processors. The electronic device 700 also includes system memory 702, which may correspond to any combination of volatile and/or non-volatile storage mechanisms. The system memory 702 stores information that provides operating system component operating system 704, various program modules 706, program data 708, and/or other components. The program modules 706 may include instructions. In one embodiment, the system memory 702 stores instructions of methods to control the operation of the electronic device 700. The electronic device 700 performs functions by using the processor(s) 720 to execute instructions provided by the system memory 702.

The electronic device 700 also includes a data storage device 710 that may be composed of one or more types of removable storage and/or one or more types of non-removable storage. The data storage device 710 includes a computer-readable storage medium 712 on which is stored one or more sets of instructions embodying any of the methodologies or functions described herein. Instructions for the program modules 706 may reside, completely or at least partially, within the computer-readable storage medium 712, system memory 702 and/or within the processor(s) 720 during execution thereof by the electronic device 700, the system memory 702, and the processor(s) 720 also constituting computer-readable media. The electronic device 700 may also include one or more input device(s) 714 (keyboard, mouse device, specialized selection keys, etc.) and one or more output device(s) 716 (displays, printers, audio output mechanisms, etc.).

The electronic device 700 further includes a modem modem(s) 718 to allow the electronic device 700 to communicate via wireless connections (e.g., provided by the wireless communication system) with other computing devices, such as remote computers, an item providing system, and so forth. The modem modem(s) 718 can be connected to one or more radio communication modules 724. The communication module(s) 724 may be a wireless local area network (WLAN) module, a Wide Area Network (WAN) module, a personal area network (PAN) module, a Global Positioning System (GPS) module, or the like. The antenna structures (antenna(s) 726, 728, and 730) are coupled to the front-end circuitry 722, which is coupled to the modem(s) 718. The front-end circuitry 722 may include radio front-end circuitry, antenna switching circuitry, impedance matching circuitry, or the like. The antennas antenna 728, 730 may be GPS antennas, Near-Field Communication (NFC) antennas, other WAN antennas, WLAN or PAN antennas, or the like. The modem(s) 718 allows the electronic device 700 to handle both voice and non-voice communications (such as communications for text messages, multimedia messages, media downloads, web browsing, etc.) with a wireless communication system. The modem(s) 718 may provide network connectivity using any type of mobile network technology including, for example, cellular digital packet data (CDPD), general packet radio service (GPRS), EDGE, universal mobile telecommunications system (UMTS), 1 times radio transmission technology (1×RTT), evaluation data optimized (EVDO), high-speed down-link packet access (HSDPA), Wi-Fi®, Long Term Evolution (LTE) and LTE Advanced (sometimes generally referred to as 4G), etc.

The modem(s) 718 may generate signals and send these signals to antenna(s) 726 of a first type (e.g., WLAN 5/6+ GHz), antenna(s) 728 of a second type (e.g., WLAN 2.4 GHz), and/or antenna(s) 730 of a third type (e.g., WAN), via Front-end circuitry 722, and Communication module(s) 724 as described herein. Antennas 726, 728, 730 may be configured to transmit in different frequency bands and/or using different wireless communication protocols. The antennas 726, 728, 730 may be directional, omnidirectional, or non-directional antennas. In addition to sending data, antennas 726, 728, 730 may also receive data, which is sent to appropriate communication modules connected to the antennas. One of the antennas 726, 728, 730 may be any combination of the antenna structures described herein.

In one embodiment, the electronic device 700 establishes a first connection using a first wireless communication protocol and a second connection using a different wireless communication protocol. The first wireless connection and second wireless connection may be active concurrently, for example, if an electronic device is receiving a media item from another electronic device (e.g., a mini-POP node) via the first connection) and transferring a file to another user device (e.g., via the second connection) at the same time. Alternatively, the two connections may be active concurrently during wireless communications with multiple devices. In one embodiment, the first wireless connection is associated with a first resonant mode of an antenna structure that operates at a first frequency band. The second wireless connection is associated with a second resonant mode of the antenna structure that operates at a second frequency band. In another embodiment, the first wireless connection is associated with a first antenna structure, and the second wireless connection is associated with a second antenna.

Though a modem 718 is shown to control transmission and reception via antenna (726, 728, 730), the electronic device 700 may alternatively include multiple modems, each of which is configured to transmit/receive data via a different antenna and/or wireless transmission protocol.

In the above description, numerous details are set forth. It will be apparent, however, to one of ordinary skill in the art having the benefit of this disclosure, that embodiments may be practiced without these specific details. In some instances, well-known structures and devices are shown in block diagram form rather than in detail in order to avoid obscuring the description.

Some portions of the detailed description are presented in terms of algorithms and symbolic representations of operations on data bits within a computer memory. These algorithmic descriptions and representations are the means used by those skilled in the data processing arts to convey the substance of their work most effectively to others skilled in the art. An algorithm is used herein and is generally conceived to be a self-consistent sequence of steps leading to the desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals, bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "determining," "sending," "receiving," "scheduling," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

Embodiments also relate to an apparatus for performing the operations herein. This apparatus may be specially constructed for the required purposes, or it may comprise a general-purpose computer selectively activated or reconfigured by a computer program stored in the computer. Such a computer program may be stored in a computer-readable storage medium, such as, but not limited to, any type of disk including floppy disks, optical disks, Read-Only Memories (ROMs), compact disc ROMs (CD-ROMs), and magnetic-optical disks, Random Access Memories (RAMs), EPROMs, EEPROMs, magnetic or optical cards, or any type of media suitable for storing electronic instructions.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the present embodiments as described herein. It should also be noted that the terms "when" or the phrase "in response to," as used herein, should be understood to indicate that there may be intervening time, intervening events, or both before the identified operation is performed.

It is to be understood that the above description is intended to be illustrative, and not restrictive. Many other embodiments will be apparent to those of skill in the art upon reading and understanding the above description. The scope of the present embodiments should, therefore, be determined with reference to the appended claims, along with the full scope of equivalents to which such claims are entitled.

The concepts disclosed herein may be applied within a number of different devices and computer systems, including, for example, general-purpose computing systems, multimedia set-top boxes, televisions, stereos, radios, server-client computing systems, telephone computing systems, laptop computers, cellular phones, personal digital assistants (PDAs), tablet computers, wearable computing devices (watches, glasses, etc.), other mobile devices, etc.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of computers and speech processing should recognize that components and process steps described herein may be interchangeable with other components or steps, or combinations of components or steps, and still achieve the benefits and advantages of the present disclosure. Moreover, it should be apparent to one skilled in the art, that the disclosure may be practiced without some or all of the specific details and steps disclosed herein.

Aspects of the disclosed system may be implemented as a computer method or as an article of manufacture such as a memory device or non-transitory computer readable storage medium (or one or more computer readable media). The computer readable storage medium may be readable by a computer and may comprise instructions for causing a computer or other devices to perform processes described in the present disclosure. The computer readable storage medium may be implemented by a volatile computer memory, non-volatile computer memory, hard drive, solid-state memory, flash drive, removable disk, and/or other media. In addition, components of system may be implemented in different forms of software, firmware, and/or hardware, such as an acoustic front end (AFE), which comprises, among other things, analog and/or digital filters (e.g., filters configured as firmware to a digital signal processor (DSP)). Further, the teachings of the disclosure may be performed by an application specific integrated circuit (ASIC), field programmable gate array (FPGA), or other component, for example.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without other input or prompting, whether these features, elements, and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, Z," unless specifically stated otherwise, is understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

As used in this disclosure, the term "a" or "one" may include one or more items unless specifically stated otherwise. Further, the phrase "based on" is intended to mean "based at least in part on" unless specifically stated otherwise.

What is claimed is:

1. A power management integrated circuit (PMIC) comprising:

a set of N number of power regulators, each power regulator of the set of N number of power regulators to provide an independent voltage rail to an independent subsystem of an electronic device, the independent subsystem being coupled to the PMIC, wherein N is a positive integer greater than one; and a power monitoring subsystem coupled to the set of N number of power regulators, wherein the power monitoring subsystem comprises:

an N-to-1 multiplexer;

a single analog-to-digital converter (ADC) coupled to the N-to-1 multiplexer;

a set of N number of registers, each register of the set of N number of registers to store a digital value representing power consumption of one of the independent voltage rails; and a set of N circuit branches coupled to the N-to-1 multiplexer, wherein each of the set of N circuit branches comprises:

an averaging circuit to determine an average current by measuring and averaging an input current of the independent voltage rail corresponding to the respective independent subsystem;

an oversampling circuit to determine an oversampled current by oversampling the average current; and an accumulating circuit to determine an accumulated current by accumulating the oversampled current, wherein the single ADC, for each of the independent voltage rail, is to convert the accumulated current to the digital value representing the power consumption of the respective independent voltage rail and store the digital value in the respective register of the set of N number of registers.

2. The PMIC of claim 1, wherein the power monitoring subsystem further comprises:

a second N-to-1 multiplexer coupled to each of the averaging circuits of the set of N circuit branches; and a 1-to-N de-multiplexer coupled to each of the accumulating circuits of the set of N circuit branches, wherein the oversampling circuit is a common oversampling circuit for each of the set of N circuit branches.

3. The PMIC of claim 1, wherein the power monitoring subsystem comprises a controller configured to:

receive a first command from the electronic device, wherein the first command comprises a first set of configuration parameters corresponding to a first circuit branch of the set of N circuit branches, the first set of configuration parameters comprising at least one of a dynamic range, a resolution, an accumulation time, or a sampling rate for the independent voltage rail provided to a first independent subsystem of the electronic device;

configure the first circuit branch according to the first set of configuration parameters;

receive a second command from the electronic device, wherein the second command comprises a second set of configuration parameters corresponding to a second circuit branch of the set of N circuit branches, the second set of configuration parameters comprising at least one of a dynamic range, a resolution, an accumulation time, or a sampling rate for the independent voltage rail provided to a second independent subsystem of the electronic device, wherein the second set of configuration parameters are different than the first set of configuration parameters;

configure the second circuit branch according to the second set of configuration parameters; and provide the digital values, stored in the set of N number of registers, to the electronic device.

4. A power monitoring circuit comprising:

a first circuit branch comprising a first averaging circuit, a first sampling circuit, and a first accumulating circuit, the first circuit branch corresponding to a first independent voltage rail provided to a first independent subsystem of an electronic device, the first independent subsystem being coupled to the power monitoring circuit;

a second circuit branch comprising a second averaging circuit, a second sampling circuit, and a second accumulating circuit, the second circuit branch corresponding to a second independent voltage rail provided to a second independent subsystem of the electronic device, the second independent subsystem being coupled to the power monitoring circuit; and an analog-to-digital converter (ADC) selectively coupled to the first circuit branch and the second circuit branch, wherein the ADC is configured to:

convert a first accumulated current, output by the first accumulating circuit, to a first digital value and store the first digital value in a first register, wherein the first digital value represents power consumption of the first independent subsystem; and convert a second accumulated current, output by the second accumulating circuit, to a second digital value and store the second digital value in a second register, wherein the second digital value represents power consumption of the second independent subsystem.

5. The power monitoring circuit of claim 4, further comprising:

a first power regulator to provide the first independent voltage rail;

a second power regulator to provide the second independent voltage rail; and a multiplexer coupled to the first circuit branch, the second circuit branch, and the ADC.

6. The power monitoring circuit of claim 4, wherein:

the first averaging circuit is to determine an average current by measuring and averaging an input current of the first independent voltage rail;

the first sampling circuit is to determine an oversampled current by oversampling the average current; and the first accumulating circuit is to determine the first accumulated current by accumulating the oversampled current.

7. The power monitoring circuit of claim 4, further comprising:

a first multiplexer coupled to the first averaging circuit, the second averaging circuit, and the first sampling circuit, wherein the first sampling circuit and the second sampling circuit are a common sampling circuit;

a de-multiplexer coupled to the common sampling circuit, the first accumulating circuit, and the second accumulating circuit; and a second multiplexer coupled to the first accumulating circuit, the second accumulating circuit, and the ADC.

8. The power monitoring circuit of claim 4, further comprising:

a first multiplexer coupled to the first averaging circuit, the second averaging circuit, and the first sampling circuit, wherein the first sampling circuit and the second sampling circuit are a common sampling circuit, and wherein the first accumulating circuit and the second accumulating circuit are a common accumulating circuit, wherein the ADC is coupled to the common accumulating circuit.

9. The power monitoring circuit of claim 4, further comprising a controller configured to:

receive a first command from the electronic device, wherein the first command comprises a first set of configuration parameters corresponding to the first circuit branch, the first set of configuration parameters comprising at least one of a dynamic range, a resolution, an accumulation time, or a sampling rate for the first independent voltage rail;

configure the first circuit branch according to the first set of configuration parameters;

receive a second command from the electronic device, wherein the second command comprises a second set of configuration parameters corresponding to the second circuit branch, the second set of configuration parameters comprising at least one of a dynamic range, a resolution, an accumulation time, or a sampling rate for the second independent voltage rail;

configure the second circuit branch according to the second set of configuration parameters; and provide the first digital value and the second digital value to the electronic device.

10. The power monitoring circuit of claim 4, wherein the first averaging circuit is a first time-constant averaging circuit coupled to a first low-pass filter, wherein the second averaging circuit is a second time-constant averaging circuit coupled to a second low-pass filter.

11. The power monitoring circuit of claim 4, wherein:

the first sampling circuit is to sample a first average current, output from the first averaging circuit, using a first sampling rate; and the second sampling circuit is to sample a second average current, output from the second averaging circuit, using a second sampling rate that is different than the first sampling rate.

12. The power monitoring circuit of claim 4, wherein:

the first accumulating circuit is to accumulate a first sampled current, output from the first sampling circuit, over a first accumulation period; and the second accumulating circuit is to accumulate a second sampled current, output from the second sampling circuit, over a second accumulation period that is different than the first accumulation period.

13. The power monitoring circuit of claim 4, wherein the electronic device comprises a system on chip (SoC) comprising a central processing unit (CPU) and at least one of a wireless communication component, an accelerator, a video processing module, or an audio processing module, wherein the CPU is the first independent subsystem, and the at least one of the wireless communication component, the accelerator, the video processing module, or the audio processing module is the second independent subsystem.

14. The power monitoring circuit of claim 4, further comprising a controller configured to:

receive a first command from a video processing module of the electronic device, wherein the first command comprises a parameter that specifies an averaging window length, wherein the averaging window length corresponds to a fixed frame rate of the video processing module; and configure the first circuit branch according to the parameter; and provide the first digital value to the electronic device.

15. The power monitoring circuit of claim 4, wherein:

the first averaging circuit comprises an integrator;

the first sampling circuit comprises a counter and reset logic coupled to the output of the integrator; and the first accumulating circuit comprises accumulation logic coupled to the output of the counter.

16. The power monitoring circuit of claim 4, wherein:

the first averaging circuit comprises a switched-based accumulator;

the first sampling circuit comprises a counter and reset logic coupled to the switched-based accumulator; and the first accumulating circuit comprises accumulation logic coupled to the output of the switched-based accumulator.

17. A method of operating a power monitoring circuit, the method comprising:

determining a first average current from a first input current of a first independent voltage rail provided to a first independent subsystem of an electronic device coupled to the power monitoring circuit;

determining a first oversampled current by oversampling the first average current;

determining a first accumulated current by accumulating the first oversampled current;

determining a second average current from a second input current of a second independent voltage rail provided to a second independent subsystem of the electronic device;

determining a second oversampled current by oversampling the second average current;

determining a second accumulated current by accumulating the second oversampled current;

converting, using an analog-to-digital converter (ADC), a first accumulated current to a first digital value and storing the first digital value in a first register, wherein the first digital value represents power consumption of the first independent subsystem; and converting, using the ADC, a second accumulated current to a second digital value and store the second digital value in a second register, wherein the second digital value represents power consumption of the second independent subsystem.

18. The method of claim 17, wherein determining the first oversampled current and determining the second oversampled current comprises determining the first oversampled current and the second oversampled current using a common oversampling circuit.

19. The method of claim 17, wherein:

determining the first oversampled current and determining the second oversampled current comprises determining the first oversampled current and the second oversampled current using a common oversampling circuit; and determining the first accumulated current and determining the second accumulated current comprises determining the first accumulated current and the second accumulated current using a common accumulating circuit.

20. The method of claim 17, further comprising:

receiving a first command from the electronic device, wherein the first command comprises a first set of configuration parameters corresponding to the first independent voltage rail;

configuring the power monitoring circuit to determine the first digital value according to the first set of configuration parameters;

receiving a second command from the electronic device, wherein the second command comprises a second set of configuration parameters corresponding to the second independent voltage rail;

configuring the power monitoring circuit to determine the second digital value according to the first set of configuration parameters; and providing the first digital value and the second digital value to the electronic device.

* * * * *